US006369639B2

(12) United States Patent
Strand et al.

(10) Patent No.: US 6,369,639 B2
(45) Date of Patent: Apr. 9, 2002

(54) INVERTER CIRCUIT

(75) Inventors: Timothy Strand, Wiltshire; Matthew Littlefair, Slough, both of (GB)

(73) Assignee: Nordson Corporation, Westlake, OH (US)

( * ) Notice: Subject to any disclaimer, the term of this patent is extended or adjusted under 35 U.S.C. 154(b) by 0 days.

(21) Appl. No.: 09/821,591

(22) Filed: Mar. 29, 2001

(30) Foreign Application Priority Data

Mar. 31, 2000 (GB) ............................................ 0007924

(51) Int. Cl.[7] ............................................ H03K 17/56

(52) U.S. Cl. ........................................ 327/423; 363/132

(58) Field of Search ......................... 327/420, 423–427, 327/434–437, 440, 478, 502, 494, 580, 584; 363/131, 132, 141, 142

(56) References Cited

U.S. PATENT DOCUMENTS 6,175,510 B1 * 1/2001 Loh ............................ 307/66
6,266,260 B1 * 7/2001 Zahrte, Sr. et al. ......... 363/132
6,269,015 B1 * 7/2001 Ikeda et al. ................. 363/142
6,272,028 B1 * 8/2001 Satoh et al. ................ 363/141
6,278,080 B1 * 8/2001 Moriguchi et al. ......... 363/141

* cited by examiner

*Primary Examiner*—My-Trang Nu Ton
(74) *Attorney, Agent, or Firm*—Wood, Herron & Evans, L.L.P.

(57) ABSTRACT

An inverter circuit has first and second input terminals adapted to be connected to the voltage. First and second switching devices are connected in series at a first junction. The first switching device connected to the first input terminal, and the second switching device adapted to be connected to one side of the load. Third and fourth switching devices connected in series at a second junction. The third switching device is connected to an opposite side of the load, and the fourth switching device connected to the second input terminal. A voltage divider is connected between the first and second input terminals and provides an output potential. A first current steering device is connected between the potential from the voltage divider and the first junction. A second current steering device is connected between the potential from the voltage divider and the second junction. By switching on the second and third switching devices and then the first and fourth switching devices, and then, switching off the first and fourth switching devices before switching off the second and third switching devices, the inverter circuit prevents more than half of the voltage from being connected across any one of the switching devices.

10 Claims, 2 Drawing Sheets

INVERTER CIRCUIT

This application claims the priority of British Patent Application No. 0007924.4 filed Mar. 31, 2000, the disclosure of which is hereby fully incorporated by reference herein.

FIELD OF THE INVENTION

The present invention relates to an inverter and more particularly, to an inverter that is able to withstand relatively high voltages.

BACKGROUND OF THE INVENTION

The invention concerns the problem of fabricating an inverter for use with applied voltages exceeding the magnitude tolerable by the switching devices used in the inverter.

A switching device in a typical half bridge inverter may be subjected to a large portion or possibly all of the voltage applied to the inverter. In a full bridge inverter, each switching device will normally have a maximum of only half the supply voltage connected across it. However, if one switching device is turned on fractionally before its counterpart in the other half of the circuit, its counterpart will be subjected to at least a substantial proportion of the supply voltage. If the voltage rating of the switching device is thereby exceeded, it is likely to fail.

SUMMARY OF THE INVENTION

The present invention provides a more reliable inverter circuit that is tolerant of variations in switching speeds of its components. The inverter circuit of the present invention does not permit voltages applied to the switching devices to exceed their rated voltage. Thus, the inverter circuit of the present invention is especially useful for higher voltage applications.

According to the principles of the present invention and in accordance with the described embodiments, the invention provides an inverter circuit for applying a voltage to a load. The inverter circuit has first and second input terminals adapted to be connected to the voltage. First and second switching devices are connected in series at a first junction. The first switching device is connected to the first input terminal, and the second switching device is connected to one side of the load. Third and fourth switching devices are connected in series at a second junction. The third switching device is connected to an opposite side of the load, and the fourth switching device connected to the second input terminal. A voltage divider is connected between the input terminals and provides an output potential. A first current steering device is connected between the output potential from the voltage divider and the first junction. A second current steering device is connected between the output potential from the voltage divider and the second junction. By switching on the second and third switching devices and thereafter the first and fourth switching devices, and then, switching off the first and fourth switching devices before switching off the second and third switching devices, the inverter circuit prevents more than half of the voltage from being connected across any one of the switching devices.

In one aspect of the invention, the inverter circuit further comprises fifth and sixth switching devices connected in series at a third junction. The fifth switching device is connected to the first input terminal, and the sixth switching device is connected to the opposite side of the load. Seventh and eighth switching devices are connected in series at a fourth junction. The seventh switching device is connected to the one side of the load, and the eighth switching device is connected to the second input terminal. A third current steering device is connected between the output potential from the voltage divider and the first junction, and a fourth current steering device is connected between the output potential from the voltage divider and the second junction. By switching on the sixth and seventh switching devices and thereafter the fifth and eighth switching devices, and then, switching off the fifth and eighth switching devices before switching off the sixth and seventh switching devices, the inverter circuit prevents more than half of the voltage from being connected across any one of the switching devices; and further, it applies a voltage across the load in the opposite direction to the first to fourth switching devices.

In another embodiment, the invention further provides a method of operating the inverter circuit described above by first, switching on the second and third switching devices, and thereafter, switching on the first and fourth switching devices. The inverter circuit further operates by switching off the first and fourth switching devices and thereafter, switching off the second and third switching devices to prevent more than half the circuit input voltage being connected across any one of the switching devices.

In one aspect of this embodiment, the inverter circuit operates by switching on the sixth and seventh switching devices and thereafter, switching on the fifth and eighth switching devices. The inverter circuit further operates by switching off the fifth and eighth switching devices and thereafter, switching off the sixth and seventh switching devices. That operation of the inverter circuit prevents more than half the circuit input voltage from being connected across any one of switching devices; and further, it applies a voltage across the load in the opposite direction to the first to fourth switching devices.

These and other objects and advantages of the present invention will become more readily apparent during the following detailed description.

BRIEF DESCRIPTION OF THE DRAWINGS

A prior art inverter and an embodiment of the invention will now be described by way of example and with reference to the accompanying drawings wherein.

DETAILED DESCRIPTION OF THE INVENTION

Figure 1:
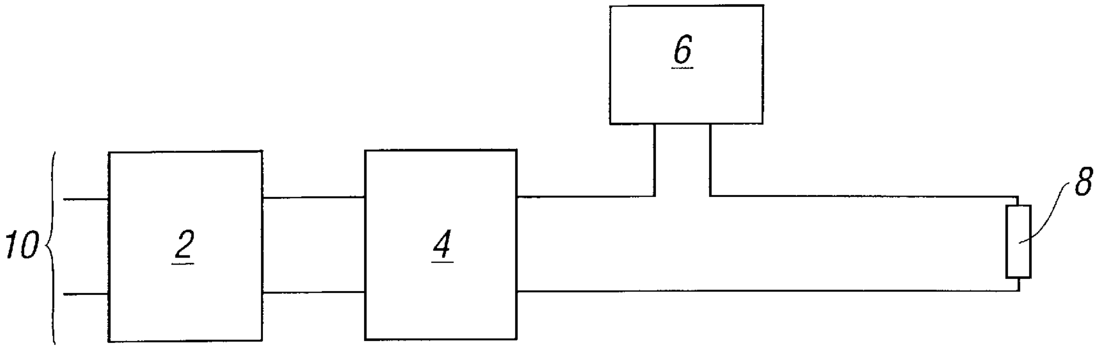
FIG. 1 shows a block diagram of a power supply including an inverter.

A power supply for a gas discharge lamp 8 is shown schematically in FIG. 1. It consists of an AC to DC converter 2, an inverter circuit 4, and an igniter circuit 6. The AC to DC converter 2 has a pair of input terminals 10 for connection to an AC supply. The DC output of the converter is fed to the inverter 4, which in turn outputs a low frequency square wave for application to the lamp 8. The igniter circuit 6 is operable to generate high voltages for initial ignition of the lamp 8.

Figure 2:
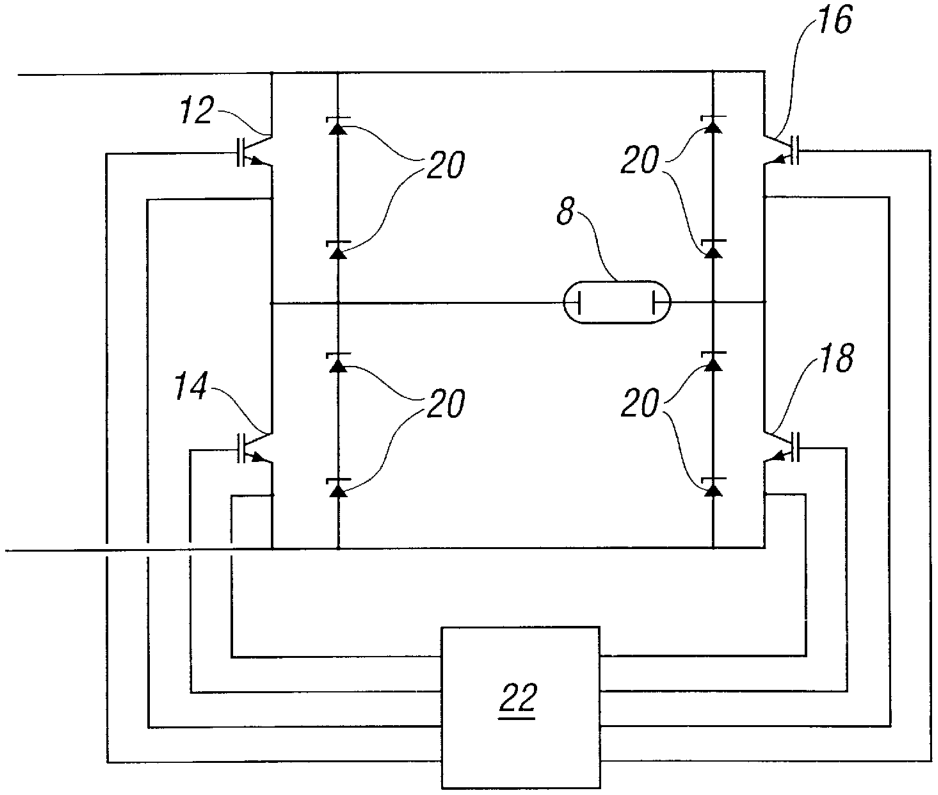
FIG. 2 PRIOR ART
FIG. 2 shows a circuit diagram of a known full bridge inverter circuit.

FIG. 2 shows a conventional diagonally-switched full bridge inverter configuration. It comprises four switching devices in the form of transistors 12, 14, 16 and 18. Each pair of transistors 12, 14, and 16, 18 forms a half bridge, with a lamp load 8 connected between the midpoints of the half bridges. A pair 20 of protection diodes is connected between the collector and emitter of each transistor. A drive waveform generator 22 controls the switching of the transistors. Transistor pairs 12, 18 and 14, 16 are alternately switched on to produce a bi-directional square wave output across the lamp 8.

If, for example, transistor 18 is turned on fractionally before transistor 12, a large proportion of the applied supply voltage will be dropped across transistor 12. Drive waveform generator 22 cannot ensure that both devices are switched on exactly simultaneously. If a voltage is applied to transistor 12 which exceeds its rating, it may be damaged and fail.

Figure 3:
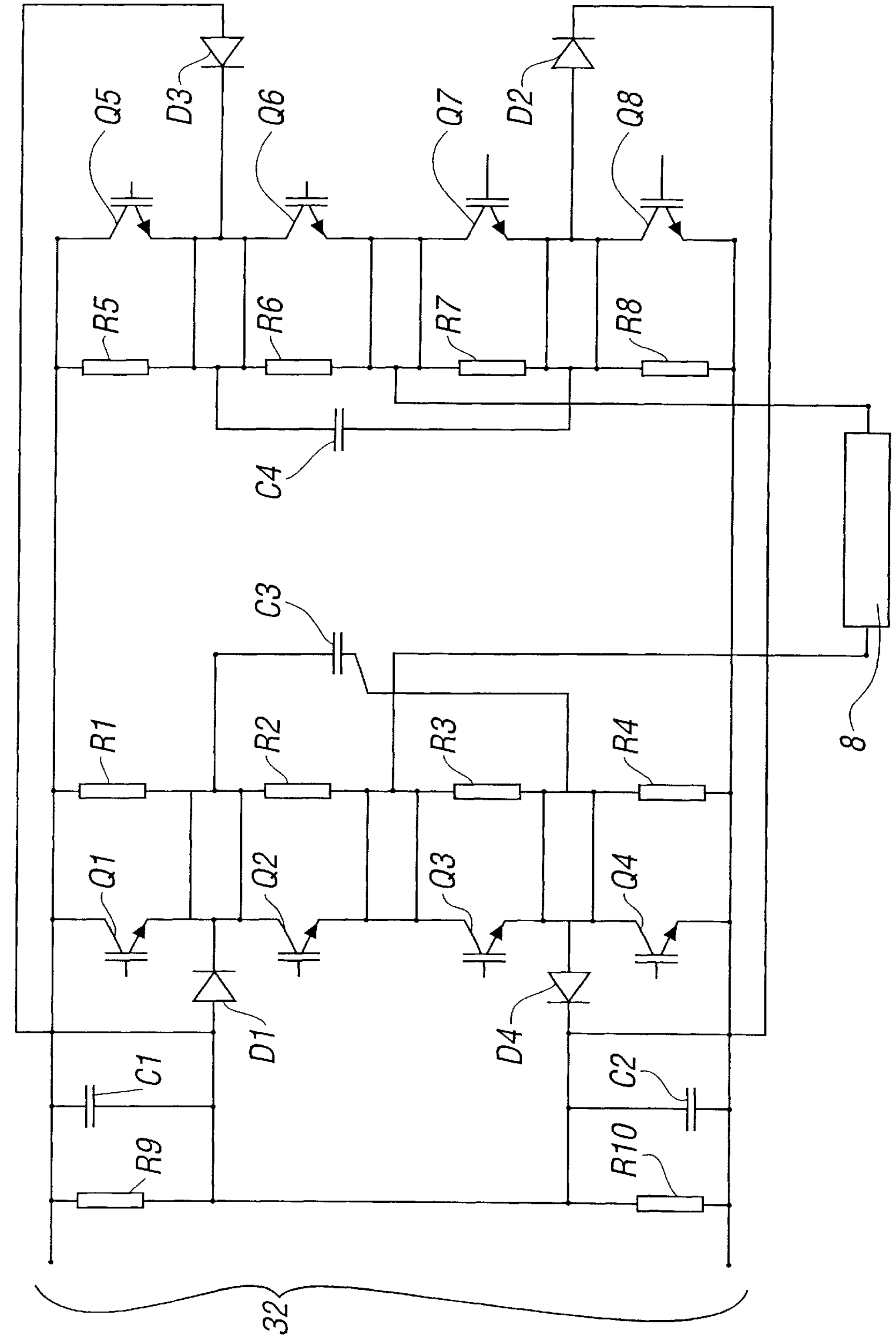
FIG. 3 shows a circuit diagram of an inverter circuit of the invention.

An inverter circuit in accordance with the present invention is shown in FIG. 3. In comparison to the inverter circuit of FIG. 2, it can be seen that a respective pair of IGBTs, Q1 and Q2; Q3 and Q4; Q5 and Q6; and Q7 and Q8 has replaced each transistor 12, 14, 16 and 18. Each pair of IGBTs is connected in series at a junction between them. Also, resistors R1 to R8 are connected in parallel with IGBTs Q1 to Q8, respectively. Resistors R9 and R10 are connected in series across a pair of input terminals 32 of the inverter forming a voltage divider having an output potential at the junction of resistors R9 and R10. Similarly, capacitors C1 and C2 are connected in series across input terminals 32, and their midpoint is connected to the junction of resistors R9 and R10. Capacitors C1 and C2 are provided to decouple the junction of the voltage divider R9, R10. A current steering device, for example, a diode D1, has an anode connected to the output potential at the junction of resistors R9, R10 and a cathode connected to the junction between IGBTs Q1 and Q2; and D1 is forward biased in that direction. Another current steering device, diode D2, has an anode connected to the junction between Q7 and Q8 and a cathode connected to the output potential at the junction between resistors R9, R10; and D2 is forward biased in that direction. Diode D3 has an anode connected to the output potential at the junction of resistors R9, R10 and a cathode connected to the junction between Q5 and Q6; and D3 is forward biased in that direction. Finally, diode D4 has an anode is connected to the junction between Q3 and Q4 and a cathode connected to the output potential at the junction of resistors R9, R10; and D4 is forward biased in that direction. A lamp load 8 has one side connected to the junction between Q2 and Q3 and an opposite side connected to the junction between Q6 and Q7.

Capacitors C3 and C4 may be connected as illustrated across Q2, Q3 and Q6, Q7, respectively, to reduce noise.

Typical values for the components shown in FIG. 3 are as follows:

| | |
|---|---|
| C1, C2 | 1 μF |
| C3, C4 | 10 nF |
| D1 to D4 | 1200 V rating |
| R1 to R8 | 200 kOhm |
| R9, R10 | 440 kOhm |

It may be cost effective to replace resistors R1 to R10 by combinations of smaller lower value devices of equivalent total resistance.

The operation of the inverter circuit shown in FIG. 3 will now be described. Initially, all the IGBTs Q1 to Q8 are switched off. The resistors R1 to R8 ensure that the voltage across each IGBT is less than a quarter of the supply voltage. Equal voltages exist across the capacitors C1 and C2. Turning on Q2 and Q7 will place a maximum of half the supply voltage across Q1 and Q8, because diodes D1 and D2 conduct and are tied to the center point voltage at the junction of C1 and C2. Subsequently turning on Q1 and Q8 applies the supply voltage to the load for the required period.

The switching sequence is then reversed when turning off. In this way, IGBTs Q1, Q2, Q7 and Q8 will only ever be subjected to a maximum of half the supply voltage. A corresponding sequence applies to IGBTs Q3, Q4, Q5 and Q6 during the opposite period of operation of the inverter.

An inverter circuit for use in powering a UV arc tube may need to withstand 2000 volts and deliver up to 25 amps to its load. Commercially available IGBTs of reasonable cost for PCB mounting have breakdown voltages of 1200 volts. The voltage sharing scheme described above ensures that the IGBTs have less than 1200 volts applied to them.

It will be appreciated that additional switching devices can be included in one or more of the limbs of the circuit, to enable it to handle higher voltages or to allow less expensive devices with lower ratings to be used. Corresponding diodes will also need to be included to ensure the respective device switches an appropriate voltage.

The switching method described above requires no linear control circuits to ensure voltage balance. Instead, digital control techniques provide a simpler and more robust method of ensuring that none of the IGBTs see voltages beyond their ratings.

While the present invention has been illustrated by a description of a described embodiment and while these embodiments have been described in some detail, it is not the intention of the Applicants to restrict or in any way limit the scope of the appended claims to such detail. Additional advantages and modifications will readily appear to those skilled in the art. The various features of the invention may be used alone or in numerous combinations depending on the needs and preferences of the user. This has been a description of the present invention, along with the methods of practicing the present invention as currently known. However, the invention itself should only be defined by the appended claims, wherein

We claim:

1. An inverter circuit for applying a voltage to a load comprising:

first and second input terminals adapted to be connected to the voltage;

first and second switching devices connected in series at a first junction, the first switching device connected to the first input terminal and the second switching device adapted to be connected to one side of the load;

third and fourth switching devices connected in series at a second junction, the third switching device adapted to be connected to an opposite side of the load and the fourth switching device connected to the second input terminal;

a voltage divider connected between the first and second input terminals and providing a potential;

a first current steering device connected between said potential from said voltage divider and said first junction;

a second current steering device connected between said potential from said voltage divider and said second junction, whereby switching on said second and third switching devices and then said first and fourth switching devices, and then switching off said first and fourth switching devices before switching off said second and third switching devices prevents more than half of said voltage from being connected across any one of said switching devices.

2. The inverter circuit of claim 1 wherein said first current steering device further comprises a first diode with an anode connected to said potential from said voltage divider and a cathode connected to said first junction, and said second current steering device further comprises a second diode with an anode connected to said second junction and a cathode connected to said potential from said voltage divider.

3. The inverter circuit of claim 1 further comprising:

fifth and sixth switching devices connected in series at a third junction, the fifth switching device connected to the first input terminal and the sixth switching device adapted to be connected to the opposite side of the load;

seventh and eighth switching devices connected in series at a fourth junction, the seventh switching device adapted to be connected to the one side of the load and the eighth switching device connected to the second input terminal;

a third current steering device connected between said potential from said voltage divider and said first junction;

a fourth current steering device connected between said potential from said voltage divider and said second junction, whereby switching on said sixth and seventh switching devices and then said fifth and eighth switching devices, and then switching off said fifth and eighth switching devices before switching off said sixth and seventh switching devices prevents more than half of said voltage from being connected across any one of said switching devices, and applies a voltage across the load in the opposite direction to the first to fourth switching devices.

4. The inverter of claim 3 wherein said third current steering device further comprises a third diode with an anode connected to said potential from said voltage divider and a cathode connected to the third junction, and said fourth current steering device is a fourth diode with an anode connected to the fourth junction and a cathode connected to said potential from said voltage divider.

5. The inverter circuit of claim 1 wherein each of said switching devices comprises an IGBT.

6. A power supply for applying a voltage to a load comprising:

a voltage source;

first and second input terminals connected to the voltage source;

first and second switching devices connected in series at a first junction, the first switching device connected to the first input terminal and the second switching device adapted to be connected to one side of the load;

third and fourth switching devices connected in series at a second junction, the third switching device adapted to be connected to an opposite side of the load and the fourth switching device connected to the second input terminal;

a voltage divider connected between the first and second input terminals and providing a potential;

a first current steering device connected between said potential from said voltage divider and said first junction;

a second current steering device connected between said potential from said voltage divider and said second junction, whereby switching on said second and third switching devices and then said first and fourth switching devices, and then switching off said first and fourth switching devices before switching off said second and third switching devices prevents more than half of said voltage from being connected across any one of said switching devices.

7. A method of operating an inverter circuit, the inverter circuit comprising first and second input terminals connected to a voltage source, first and second switching devices connected in series at a first junction, the first switching device connected to the first input terminal and the second switching device adapted to be connected to one side of the load, third and fourth switching devices connected in series at a second junction, the third switching device adapted to be connected to an opposite side of the load and the fourth switching device connected to the second input terminal, a voltage divider connected between the first and second input terminals and providing a potential, a first current steering device connected between said potential from said voltage divider and said first junction, and a second current steering device connected between said potential from said voltage divider and said second junction, the method comprising:

switching on the second and third switching devices;

switching on the first and fourth switching devices after switching on the second and third switching devices, and switching off the first and fourth switching devices, and switching off the second and third switching devices after switching off the first and fourth switching devices to prevent more than half the circuit input voltage being connected across any one of said switching devices.

8. The method of claim 7 wherein the inverter circuit further comprises fifth and sixth switching devices connected in series at a third junction, the fifth switching device connected to the first input terminal and the sixth switching device adapted to be connected to the opposite side of the load, seventh and eighth switching devices connected in series at a fourth junction, the seventh switching device adapted to be connected to the one side of the load and the eighth switching device connected to the second input terminal, a third current steering device connected between said potential from said voltage divider and said first junction and a fourth current steering device connected between said potential from said voltage divider and said second junction, and the method further comprises:

switching on the sixth and seventh switching devices;

switching on the fifth and eighth switching devices after switching on the sixth and seventh switching devices;

switching off the fifth and eighth switching devices; and switching off the sixth and seventh switching devices after switching off the fifth and eighth switching devices to prevent more than half the circuit input voltage being connected across any one of the switching devices, and applies a voltage across the load in the opposite direction to the first to fourth switching devices.

9. The method of claim 7 wherein at least one additional switching device is connected in series with at least one pair of the switching devices, with at least one additional current steering device being provided between the potential from the voltage divider and a junction of the respective additional switching device and an adjacent switching device, the method further comprising:

switching the switching devices on an off in sequence such that the voltage applied across each switching device is less than a respective predetermined threshold.

10. The method of claim 7 wherein the load is a gas discharge lamp.

* * * * *